United States Patent [19]
Flint et al.

[11] Patent Number: 5,748,443
[45] Date of Patent: May 5, 1998

[54] MATING ADAPTER BETWEEN A MODULE AND CHASSIS OF A COMPUTER PROCESSING SYSTEM

[75] Inventors: Ephraim Bemis Flint, Garrison; John Peter Karidis, Ossining; Gerard McVicker, Wappingers Falls; William Edward Pence, New York, all of N.Y.

[73] Assignee: International Business Machines Corporation, Armonk, N.Y.

[21] Appl. No.: 763,654

[22] Filed: Dec. 11, 1996

Related U.S. Application Data

[63] Continuation of Ser. No. 368,188, Jan. 4, 1995, abandoned.

[51] Int. Cl.[6] .............................. H05K 5/00; H05K 7/10; H01R 25/00
[52] U.S. Cl. .............................. 361/686; 361/683; 361/727; 361/729; 439/638; 439/639
[58] Field of Search .............................. 361/683–686, 361/724, 725–727, 928.1, 728, 729; 439/638, 639

[56] References Cited

U.S. PATENT DOCUMENTS

| 5,227,957 | 7/1993 | Deters | 361/686 |
|---|---|---|---|
| 5,331,509 | 7/1994 | Kikinis | 361/686 |

Primary Examiner—Leo P. Picard
Assistant Examiner—Jayprakash N. Gandhi
Attorney, Agent, or Firm—Jay P. Sbrollini

[57] ABSTRACT

A computer system includes a chassis having an internal connector with a first portion in electrical contact with a first external peripheral device, and second portion in electrical contact with a second external peripheral device. An adapter is coupled between an internal device and the internal connector. The internal device is associated with either the first or second external peripheral devices. The adapter has either a first portion that connects the internal device to the first portion of the internal connector or a second portion that connects the internal device to the second portion of the internal connector in order to couple the internal device to its associated external peripheral device.

17 Claims, 7 Drawing Sheets

MATING ADAPTER BETWEEN A MODULE AND CHASSIS OF A COMPUTER PROCESSING SYSTEM

CROSS REFERENCE TO RELATED APPLICATIONS

This application is a continuation of U.S. application Ser. No. 08/368,192, filed Jan. 24, 1995, now abandoned, entitled "A Cartridge Based Design for Mobile and Fixed Computers" (attorney docket No. Y0994.112), filed concurrently herewith.

BACKGROUND OF THE INVENTION

The invention relates to computer processing systems, and, more particularly, to the packaging of components of computer processing systems.

Computer processing systems on the market today can be segmented generally into two distinct categories: portable and fixed. Portable computer processing systems are designed to be portable between different work sites (i.e. office, home and travel) and may be characterized, for example, as luggable computer systems, laptop computer systems, notebook computer systems, sub-notebook computer systems, tablet computer systems and hand held computer systems, sometimes called Personal Digital Assistants (PDAs). On the other hand, fixed computer processing systems are intended to remain stationary in a single work site and may be characterized, for example, as desktop computer processing systems and tower computer processing systems.

Portable computer processing systems include components functionally equivalent to those of the larger fixed computer processing systems; yet the components of the portable computer processing system are designed and packaged for restricted dimensional and weight specifications required for portability. Such components often include, for example, a microprocessor, associated memory, a lightweight and compact keyboard and display, and PCMCIA standard devices such as fax-modems, wired local area network adapters, wireless local area network interface modules, digital data exchange adapters and hard disk drives. Yet, because of the dimensional and weight restrictions associated with the components of the portable computer processing system, the associated costs of the portable computer processing system are much greater than the costs of comparable fixed computer processing systems, and these additional costs are reflected in the purchase price of portable computer processing systems.

Moreover, a user may require two or more computer systems in separate applications/work modes. For example, a user may require a fixed desktop computer system for work and a portable laptop computer system for travel and home-use. In this case, the user is required to expend a heavy investment in purchasing the separate computer systems, which may limit the market for both the fixed and portable computer processing systems.

Because of these limiting cost factors, there is a long standing need in the field of computer processing systems to provide efficient and flexible computer processing systems while achieving low costs.

In another aspect, the invention relates to connecting means for connecting various peripheral devices internal to the chassis of a computer processing system, such as a PCMCIA fax-modem, to an associated peripheral device external to the chassis of the computer processing system, such as telephone line linked to a telephone network. Typically, various internal peripheral devices are uniquely connected to their associated external peripheral device. For example, an internal PCMCIA fax-modem may be designed to extend out through a slot in the chassis and include a unique connector at its exposed end to mate with a telephone line. However, such unique connecting means among the various peripheral devices may create problems in portable computer processing systems, wherein a user must first disconnect the peripheral devices to move the computer processing system from, for example, a home environment to a work environment, and then reconnect the peripherals upon return, thereby experiencing undue delay and frustration.

SUMMARY OF THE INVENTION

The above-stated problems and related problems of the prior art are solved with the principles of the present invention, mating adapter between a module and chassis of a computer processing system. In a computer system including a chassis having an internal connector with a first portion in electrical contact with a first external peripheral device, and a second portion in electrical contact with a second external peripheral device. An adapter is coupled between an internal device and the internal connector. The internal device is associated with either the first or second external peripheral devices. The adapter has either a first portion that connects the internal device to the first portion of the internal connector or a second portion that connects the internal device to the second portion of the internal connector in order to couple the internal device to its associated external peripheral device.

The benefits of using the adapter in conjunction with the internal connector of the chassis are two-fold. First, the user is not required to match the internal device to its associated external peripheral device because the connection between the two is automatic. And second, the internal device may be disconnected from the chassis without disturbing the associated external peripheral device, thus providing a user-friendly system.

DETAILED DESCRIPTION OF THE PREFERRED EMBODIMENTS

Figure 1:
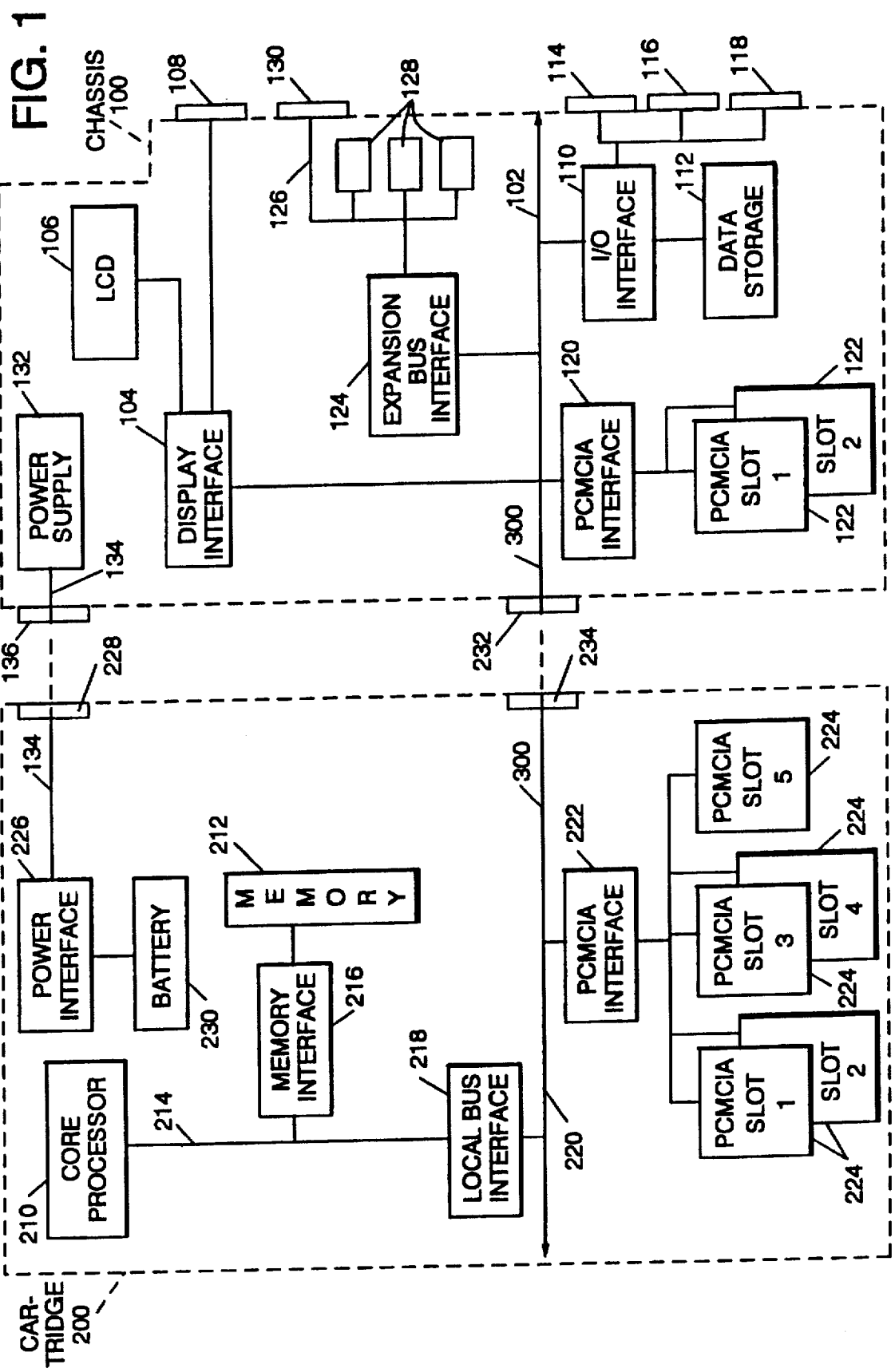
FIG. 1 is a functional block diagram of a computer processing system in accordance with the present invention.

FIG. 1 illustrates a computer processing system in accordance with the present invention. The computer processing system includes a chassis 100 detachably connected to a cartridge 200. The chassis 100 includes a plurality of user interface modules that provide an interface to devices such as a keyboard, a mouse, a display, a speaker, a microphone, a data storage device or various other input/output devices which are generally designed and packaged according to a particular application/work mode (e.g., desk-based, taking home in the evenings, traveling, hand held). The cartridge 200, on the other hand, includes components having computer functions (e.g. processing, memory, data storage) and communications functions that can be shared among the various applications/work modes. The cartridge 200 and the chassis 100 interface with one another over a common bus 300, for example, a PCI standard bus. The common bus 300 may include one or more parallel buses and/or one or more serial buses, such as an ACCESS bus, an INTEL serial bus, or an IEEE P.1394 serial bus. By detachably connecting the computer functions of the cartridge 200 to the user interface modules of the chassis 100, the cartridge 200 may be transferred from one environment to another. In each environment, the cartridge 200 may be connected to separate chassis' 100 which are optimized for use in their respective applications/work mode. By sharing components between computer processing systems in separate environments, the cost of the computer processing system in each environment is substantially decreased. Furthermore, the use of multiple user interfaces optimized for different work modes or tasks is allowed.

Specifically, the chassis 100 includes a plurality of user interface modules coupled to a first bus 102, which corresponds to the common bus 300. The user interface modules may include a display interface 104 for driving an LCD display 106 integrated into the chassis 100 or an external display connected to the chassis 100 via connector 108. The display interface typically includes a graphics controller and associated memory. The user interface modules may also include an I/O interface 110 that provides an interface to I/O devices such as a data storage device 112, an external keyboard or pointing device (i.e. mouse) via connector 114, and external peripheral devices via a serial port 116 and a parallel port 118. The data storage device 112 may be, for example, a magnetic hard disk drive, a tape back-up drive, a CD-ROM drive or an optical drive. The external peripheral devices connected to the serial port 116 and/or parallel port 118 may include a printer, a communication device such as a modem, a pointing device such as a mouse, and a data processing device that processes I/O data. The data processing device may be, for example, a video interface adapter for processing video information or an analog to digital processing device for processing analog signals input to and/or output from the system, such as voice signals input to the system from a microphone and output from the system by a speaker.

The user interface modules may also include a PCMCIA interface 120 for driving at least one PCMCIA device inserted into PCMCIA slots 122. The chassis 100 of FIG. 1 includes two PCMCIA slots 122 for example only; thus, the chassis 100 may include one or a plurality of PCMCIA slots 122 depending upon the design. The PCMCIA device inserted into the PCMCIA slots 122 may be a wired local-area network adapter, a wireless local area network interface module or a digital data exchange adapter which are used primarily in the specific location of the chassis 100. The PCMCIA device may also perform any of the functions described above with respect to the I/O interface 110. The utilization of the PCMCIA standard bus structure and PCMCIA dimensional configurations with regard to interface 120, slots 122 and the respective devices inserted into the slots 122 is for convenience purposes only, and it is well understood by those of skill in the art that a similar standard may be substituted for the PCMCIA standard.

Furthermore, the chassis 100 may include an expansion bus interface 124 that bridges the first bus 102 to an expansion bus 126, which may be, for example, an AT standard bus. The expansion bus interface 124 converts data transmitted over the first bus 102 to the expansion bus 126, and converts data transmitted over the expansion bus 126 to the first bus 102. The chassis 100 may also include expansion slots 128 and an expansion bus connector 130 coupled to the expansion bus 126 to provide an interface to additional peripheral devices such as a network interface card, a CD-ROM, and other forms of communication and storage devices. The chassis 100 of FIG. 1 includes three expansion slots 128 for example only; thus, the chassis 100 may include one or a plurality of expansion slots 128 depending upon the design.

Moreover, the chassis 100 may include a power supply 132 that provides power to each of the user interface modules and to the cartridge 200 via power bus 134 and connector 136. The power supply 132 may include a voltage conversion circuit that converts AC line power to the appropriate DC voltage levels required by the modules. The power supply 132 may also include a battery that supplies the appropriate DC voltage levels to the modules when the voltage conversion circuit is inactive. The power bus 134 and common bus 300 may share a single connector pair, for example, connectors 232,234 and/or the power bus 134 may be part of the common bus 300.

The cartridge 200 of FIG. 1 includes components having computer functions that can be shared among the various applications/work modes. Specifically, the cartridge 200 includes a core processor 210 coupled to memory 212 via a high-speed processor bus 214 and memory interface 216. The memory 212 may be system dynamic memory, cache memory, and/or non-volatile memory. The memory interface 216 performs functions such as address decoding and bus control such that the core processor 210 can read data from and write data to the memory 212. The memory interface 216 may also perform functions such as dynamic memory refresh. A processor bus interface 218 bridges the processor bus 214 to a second bus 220, which corresponds to the common bus 300. The processor bus interface 218 converts data transmitted over the processor bus 214 to the second bus 220 and converts data transmitted over the second bus 220 to the processor bus 214.

The cartridge 200 may also include components having functions that can be shared among the various applications/work modes. Specifically, the cartridge 200 may include a PCMCIA interface 222 coupled to the second bus 220 for driving at least one PCMCIA device inserted into PCMCIA slots 224. The cartridge 200 of FIG. 1 includes five PCMCIA slots 224 for example only; thus, the cartridge 200 may include one or a plurality of PCMCIA slots 224 depending upon the design. The PCMCIA device may be a communication device, such a wired local-area network adapter, a wireless local area network interface module, a digital data exchange adapter, a data storage device such a hard disk, or a data processing device that processes I/O data. The data processing device may be, for example, a video interface adapter for processing video information or an analog to digital processing device for processing analog signals input to and/or output from the system, such as voice signals input to the system from a microphone and output from the system by a speaker. The PCMCIA slots 224 may be of different configurations (i.e., Type II and Type III). To provide the user with flexibility in choosing the location of specific PCMCIA devices, preferably each of the PCMCIA slots 224 have Type II configurations. Again, the utilization of the PCMCIA standard bus structure and PCMCIA dimensional configurations with regard to interface 222, slots 224 and the respective devices inserted into the slots 224 is for convenience purposes only, and it is well understood by those of skill in the art that a similar standard may be substituted for the PCMCIA standard.

The cartridge 200 may also include a power interface 132 that provides the appropriate DC voltage levels to each of the components of the cartridge 200. The power interface 226 may be coupled to the power bus 134 of the chassis 100 by mating connector 228 to connector 136. The power interface 226 may also include a battery 230 that supplies the appropriate DC voltage levels to the components of the cartridge 200 when the cartridge 200 is separated from the chassis 100. It is contemplated that the battery 230 may be packaged in a PCMCIA device configuration and housed in a dedicated PCMCIA slot 224, thus expending one of the PCMCIA slots 224.

The components of the cartridge 200 interface with the modules of the chassis 100 over the common bus 300. The common bus 300 is constructed by mating connector 232 of the chassis 100 with connector 234 of the cartridge 200, which connects the first bus 102 of the chassis 100 to the second bus 220 of the cartridge 200. By detachably connecting the computer functions of the cartridge 200 to the user interface modules of the chassis 100, the cartridge 200 may be transferred from one environment to another. In each environment, the cartridge 200 may be connected to separate chassis' 100 which are optimized for use in their respective applications/work mode. Moreover, by sharing components between computer processing systems in separate environments, the cost of the computer processing system in each environment is substantially decreased.

Figure 2:
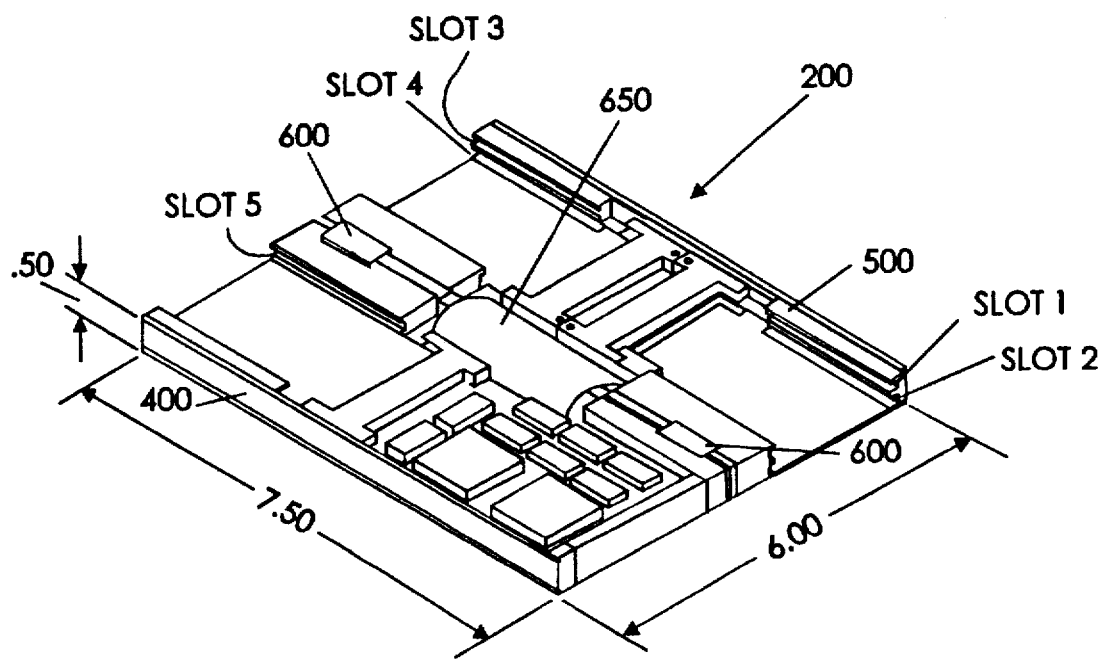
FIG. 2 is an isometric view of the cartridge of FIG. 1 configured in a first form.
Figure 3:
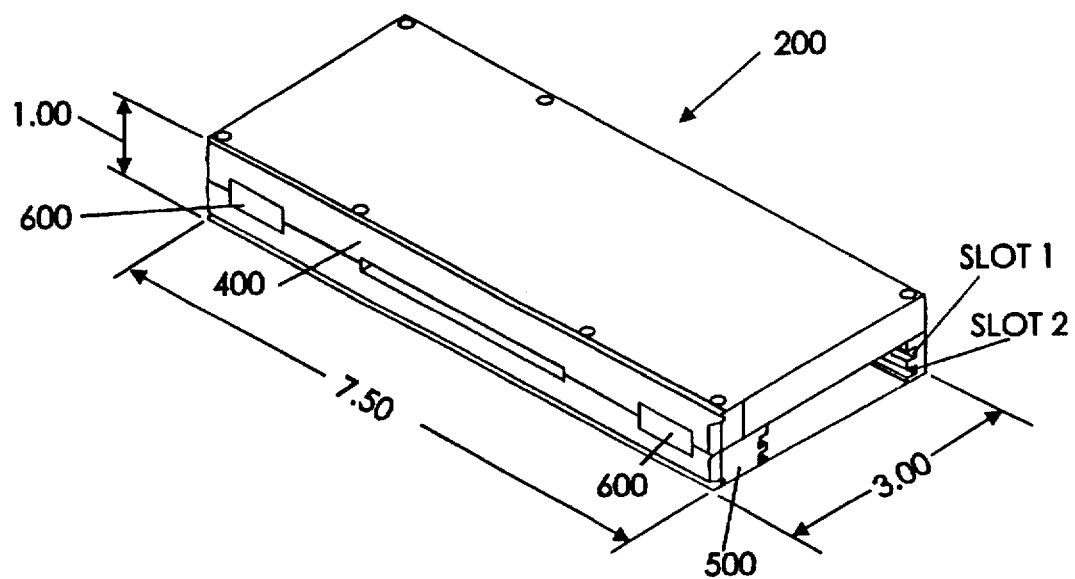
FIG. 3 is an isometric view of the cartridge of FIG. 1 configured in a second form.

The cartridge 200 of FIG. 1 may be designed such that the cartridge 200 can be configured by the user to have a first form and a second form. As shown in FIGS. 2 and 3, the cartridge 200 may include a first portion 400 connected to a second portion 500 by hinges 600 or other suitable connection devices. In this case, the electrical connections between the first portion and the second portion may be provided by a flexible cable 650. The two portions need not have identical dimensions as shown in FIG. 2.

FIG. 2 illustrates the first form of the cartridge 200 having, for example, a characteristic length, width and height of 7.5 inches, 6.0 inches and 0.5 inches, respectively, which is suitable for use in desktop, laptop, notebook and sub-notebook or other large pen or keyboard based computer processing systems. On the other hand, FIG. 3 illustrates the second form of the cartridge 200 having, for example, a characteristic length, width and height of 7.5 inches, 3.0 inches, 1.0 inches, respectively, which is suitable for a hand held device. As shown in FIG. 3, the second form has a thickness that is twice the thickness of the first form and a width that is half the width of the first form and narrow enough to be readily grasped with one hand. Because the cartridge 200 can take two forms: a first form that is wide yet thin and a second form that is narrower but thicker than the first from, the cartridge 200 can be more easily integrated both into larger computer processing systems which for ergonomic reasons have a constrained thickness and into hand-held systems which have a constrained width.

The cartridge 200 of FIG. 2 may also be configured to have a first form having, for example, a characteristic length, width and height of 7.5 inches, 6.0 inches and 0.5 inches, respectively, and a second form having, for example, a characteristic length, width and height of 3.75 inches, 6.0 inches, 1.0 inches, respectively. In this case, the second form has a thickness that is twice the thickness of the first form and a length that is half the length of the first form and narrow enough to be readily grasped with one hand.

Figure 4:
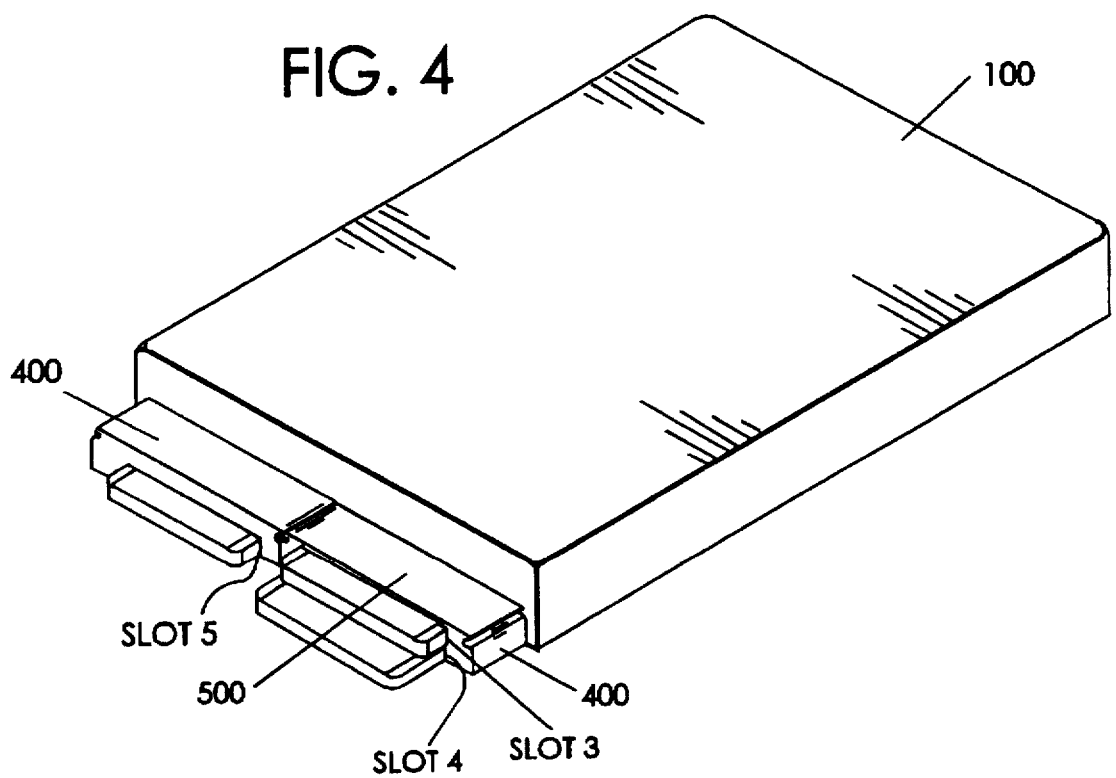
FIG. 4 is an isometric top view of the cartridge of FIG. 2 with PCMCIA cards inserted into slots 3, 4 and 5 plugged into a tablet style user interface chassis.

FIG. 4 shows the cartridge 200 of the first form as depicted in FIG. 2 with PCMCIA cards inserted into slots 3, 4 and 5 plugged into a tablet style user interface chassis.

Figure 5:
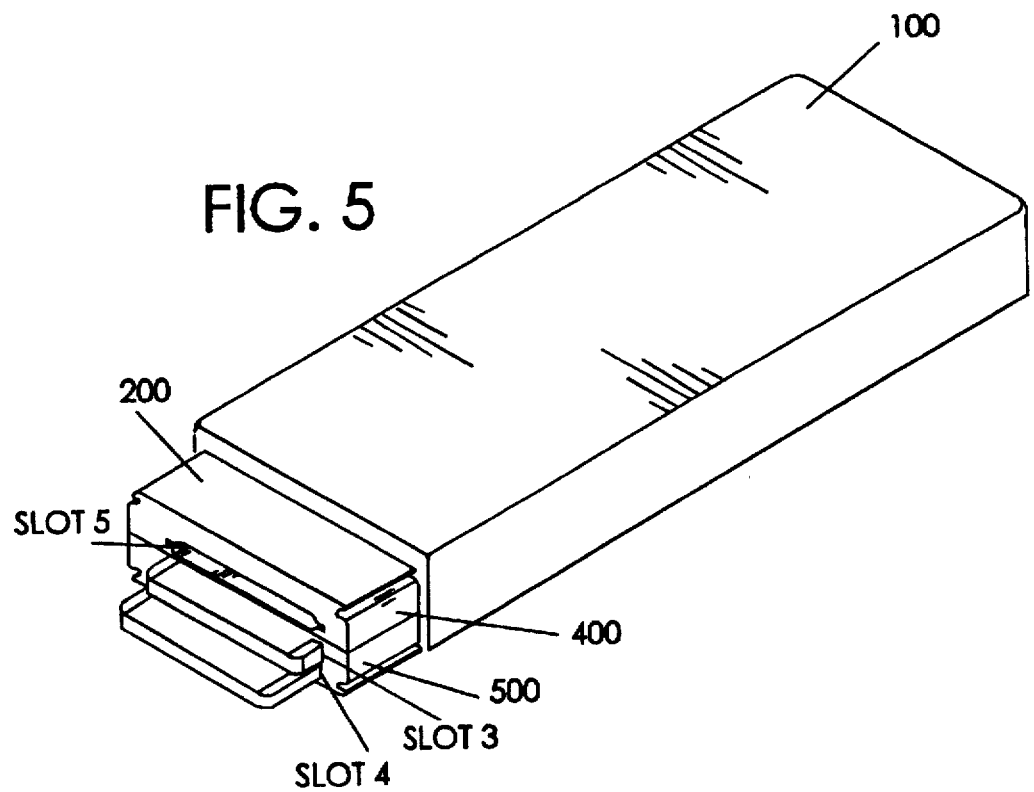
FIG. 5 is an isometric top view of the cartridge of FIG. 3 with PCMCIA cards inserted into slots 3 and 4 plugged into a hand held PDA style user interface chassis.

FIG. 5 shows the cartridge 200 of the second form as depicted in FIG. 3 with PCMCIA cards inserted into slots 3 and 4 plugged into a hand held PDA style user interface chassis.

Figure 6:
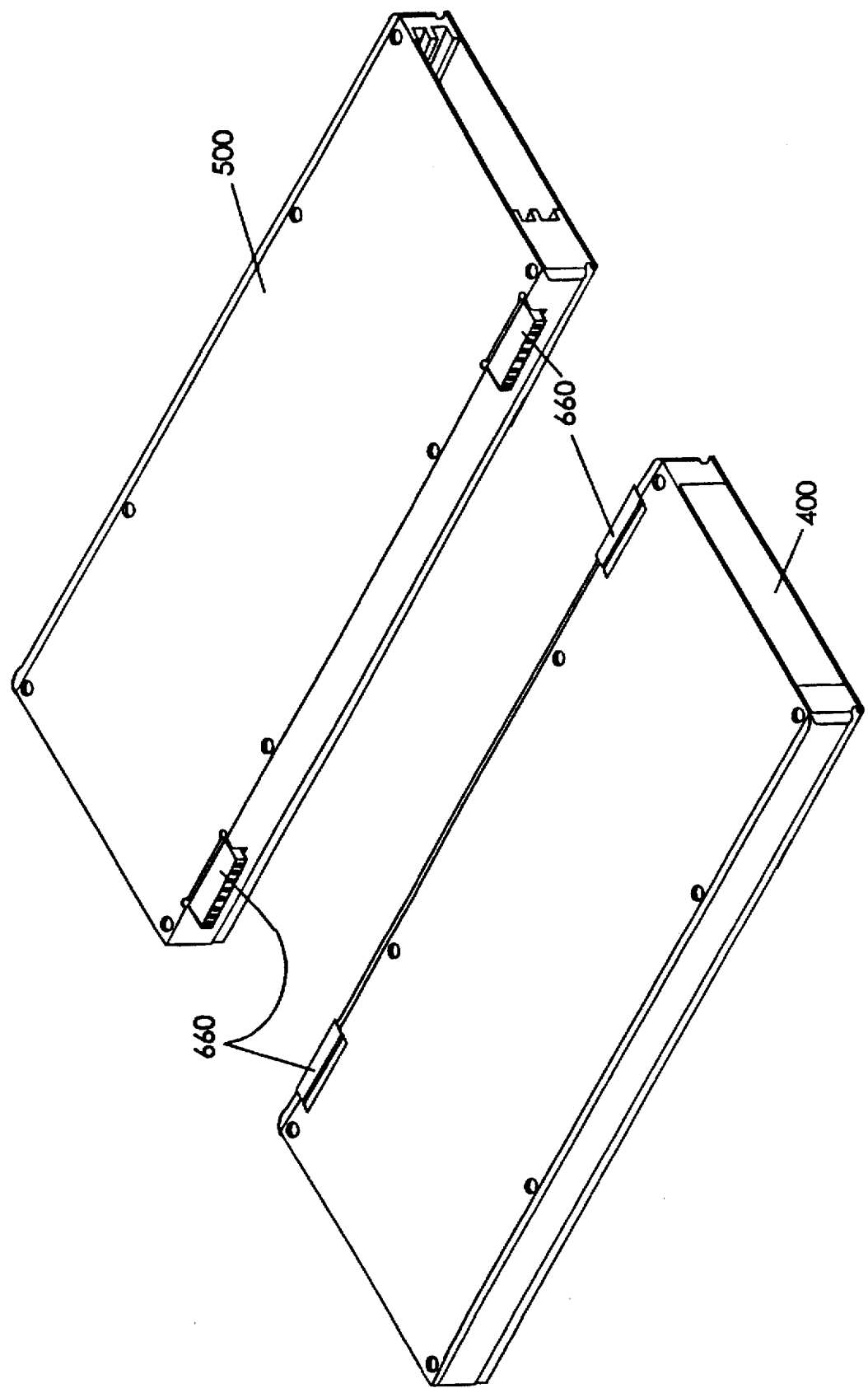
FIG. 6 is an exploded isometric view of the cartridge of FIG. 1 configured in a first form.
Figure 7:
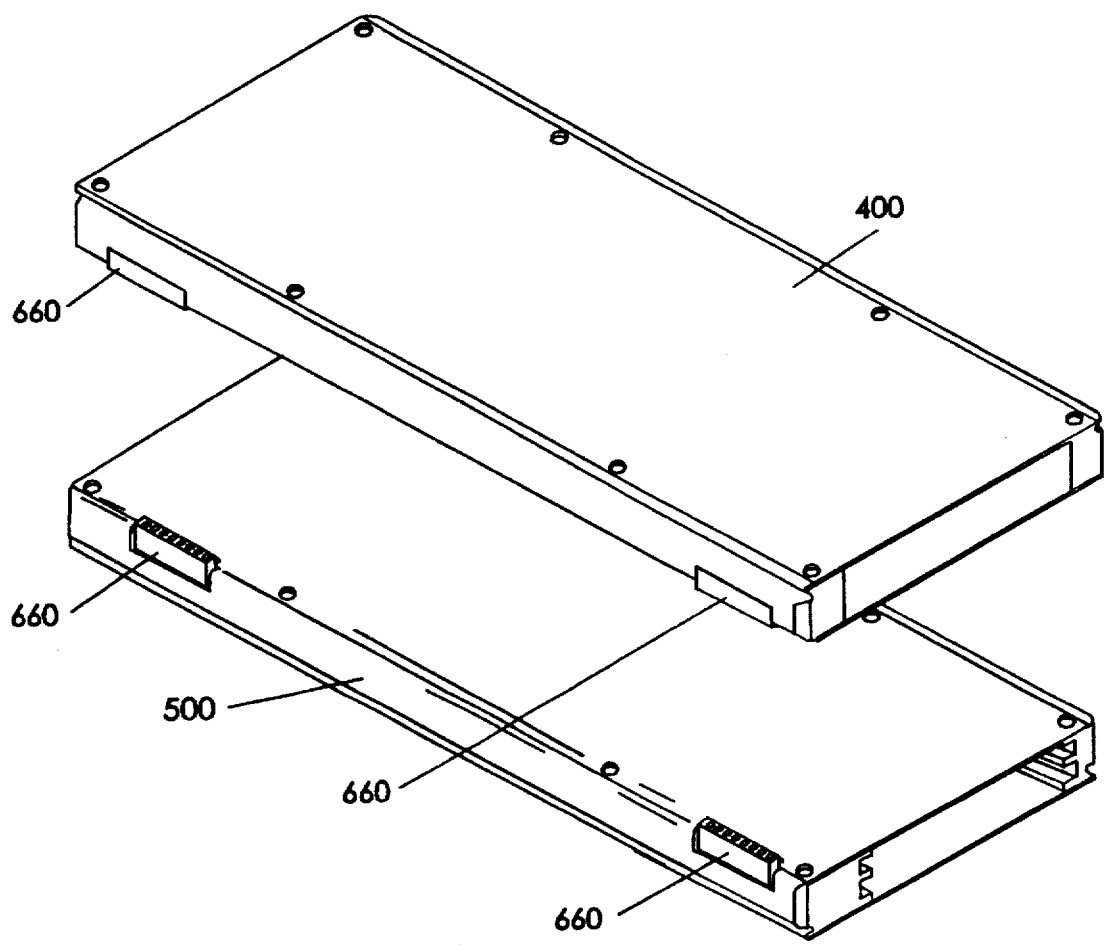
FIG. 7 is an exploded isometric view of the cartridge of FIG. 1 configured in a second form.

FIGS. 6 and 7 illustrate the cartridge 200 that utilizes at least one pair of hinged connectors 660 (for example, two pairs are shown), instead of hinges and flexible cable, to join the first portion 400 to the second portion 500. FIG. 6 illustrates the first form of the cartridge 200, which is wide and slim and thus suitable for use in desktop, laptop, notebook, sub-note book or other large pen or keyboard based computer processing systems. FIG. 7 illustrates the second form of the cartridge 200, which is narrow and thick and thus suitable for a hand held device.

Moreover, the first portion 400 may include components having computer functions (i.e., core processor 210, memory 212, memory interface 216, and local bus interface 218), and the second portion 500 may include PCMCIA components (i.e., PCMCIA interface 222 and associated devices). Using the hinged connector pairs 660 allows the first portion 400 to be disconnected from the second portion 500. In this case, the first form of the cartridge 200 may include, for example, the first and second portions 400,500 connected as shown in FIG. 6, which is suitable for use in desktop, laptop, notebook, sub-note book or other large pen or keyboard based computer processing systems. On the other hand, the second form of the cartridge 200 may include only the first portion 400, which may be suitable for a hand held device.

Figure 8:
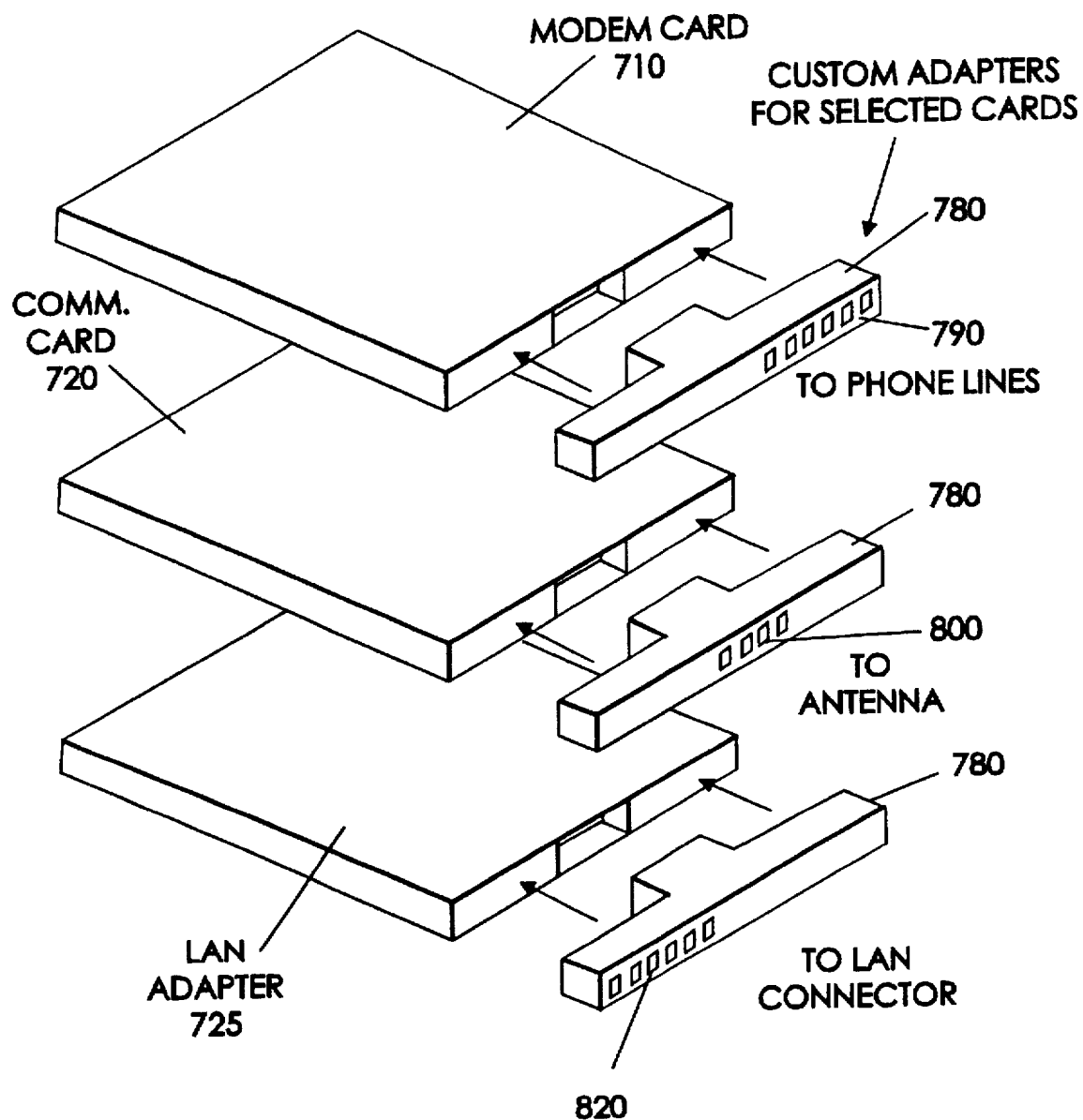
FIG. 8 illustrates adapters for connecting various PCMCIA cards to their respective peripheral devices in accordance with the present invention.
Figure 9B:
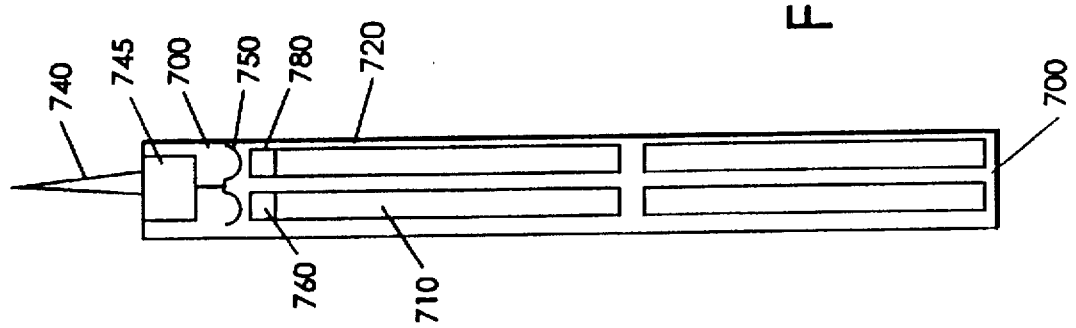
FIG. 9(b) is a cross-sectional side elevational view of FIG. 9(a).
Figure 9A:
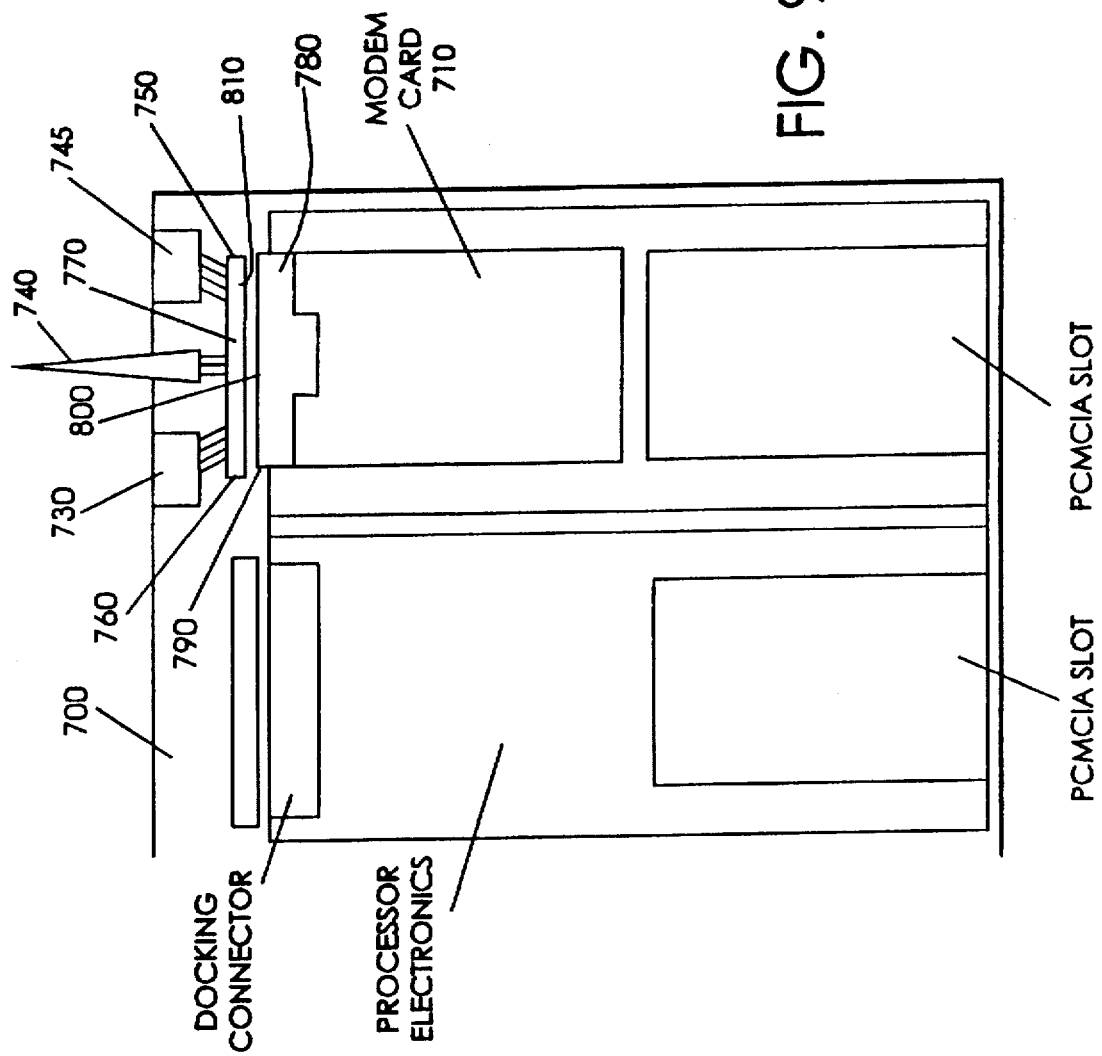
FIG. 9(a) is a functional block diagram of the adapters of FIG. 8 used in conjunction with a chassis to connect PCMCIA cards to their respective peripheral devices.

In another aspect, the computer system of the present invention as shown in FIGS. 8, 9(a) and 9(b) may include a chassis 700 that provides a cableless connection between at least two internal devices housed within the chassis 700 and external connectors of the chassis 700 that connect to external peripheral devices associated with each of the internal devices. For example, as depicted in FIGS. 8, 9(a) and 9(b), the internal devices may be a PCMCIA modem card 710, a PCMCIA wireless communication card 720 and a PCMCIA wired local area network adapter card 725. The external peripheral devices associated with each of the internal devices may be a phone line adapter 730, an antenna 740 and a local-area network connector 745, respectively. Normally, the internal devices are connected directly or indirectly via cables to their associated external peripheral devices. These cables are often annoying because they must be disconnected whenever the internal device is removed from the chassis, they must be associated with the correct internal device and external peripheral device, and they often exit the front or side of the chassis 700 in an inconvenient and unattractive manner. The computer system of the present invention eliminates the need for such annoying cables.

Specifically, the chassis 700 includes an internal connector 750 that connects to at least two internal devices. As shown in FIGS. 8, 9(a) and 9(b), the internal devices may be a PCMCIA modem card 710, a wireless PCMCIA communication card 720 or a wired PCMCIA local-area adapter card 725. The internal devices are separately associated with external peripheral devices. For example, as shown in FIGS. 8, 9(a) and 9(b), the PCMCIA modem card 710 is associated with the phone line adapter 730, the wireless PCMCIA communication card 720 is associated with the antenna 740, and the wired PCMCIA local-area network adapter card is associated with the local-area network connector 745. A first portion 760 of the internal connector 750 is in electrical contact with a first external peripheral device, for example, the phone line adapter 730. A second portion 770 of the internal connector is in electrical contact with a second external peripheral device, for example, the antenna 740. A unique adapter 780 is coupled between each internal device and the internal connector 750. The adapter 780 has either a first portion 790 that connects the internal device to the first portion 760 of the internal connector 750 or a second portion 800 that connects the internal device to the second portion 770 of the internal connector 750 in order to couple the internal device to its associated external peripheral device.

As described above, the adapters 780 and the internal connector 750 provide a cableless connection between two internal devices and their associated external peripheral devices. However, the present invention is not limited in this respect and may be used connection three or more internal devices and their associated external peripheral devices. For example, as shown in FIGS. 8 and 9(a), the internal connector 750 may include a third portion 810 in electrical contact with a third external peripheral device, for example, the local area network adapter 745. The adapter 780 then has either a first portion 790 that connects the internal device to the first portion 760 of the internal connector 750 or a second portion 800 that connects the internal device to the second portion 770 of the internal connector 750 or a third portion 820 that connects the internal device to the third portion 810 of the internal connector 750 such that the internal device is coupled to its associated external peripheral device.

The benefits of using the adapters 780 in conjunction with the internal connector 750 of the chassis 700 are two-fold. First, as long as the appropriate adapter 780 is affixed to the respective internal device, the user is not required to match the internal device to its associated external peripheral device because the connection between the two is automatic. And second, the internal device may be disconnected from the chassis 700 without disturbing the associated external peripheral device, thus providing a user-friendly system. Typically, the adapters 780 remain affixed to their respective internal device ready for insertion into another chassis 700.

Although the invention has been shown and described with respect to the particular embodiments thereof, it should be understood by those skilled in the art that the foregoing and various other changes, omissions, and additions in the form and detail thereof may be made without departing from the spirit and scope of the invention.

We claim:

1. In a computer having a chassis containing a processor, memory and a slot for housing a module coupled to said processor and memory via a bus, which slot has a connector for providing electrical contact between the module in the slot and an interface for a peripheral device, characterized by:

a) a plurality of slots in said chassis each for receiving any one of a plurality of different modules;

b) a multiplicity of different functioning modules each of which can be randomly installed in any empty one of the plurality of slots;

c) a number of peripheral device interfaces in the computer chassis each for coupling a peripheral device to one of the modules in the slots; and d) an adapter interface means for coupling any of the peripheral device interfaces to the correct module when it is installed in any one of the slots whereby modules each with a different function can be randomly inserted into any slot and be connected to the proper peripheral device and none of the other peripheral devices.

2. The apparatus of claim 1 wherein said adapter interface means includes:

i) a connector means for each slot that contains electrical connections to all of the interfaces; and ii) differently configured adapters in the slots between the connector and the module in the slot, for coupling each of the modules only to the electrical connections to only one of the interfaces.

3. The apparatus of claim 2, wherein said computer system comprises a cartridge detachably connected to a chassis, wherein said cartridge houses said processor, memory and module.

4. The apparatus of claim 2, wherein one of said modules comprises a modem, and wherein one of said peripheral device interfaces is to a telephone line.

5. The apparatus of claim 2, wherein one of said modules comprises a wired local area network adapter, and wherein one of said peripheral device interfaces is to a local area network communication link.

6. The apparatus of claim 2, wherein one of said modules comprises a wireless communication module, and wherein one of said peripheral device interfaces comprises an antenna.

7. The apparatus of claim 2, wherein one of said modules comprises a data communication module, and wherein one of said peripheral device interfaces is a data communication link.

8. The apparatus of claim 2, wherein one of said modules comprises a video interface adapter, and wherein one of said peripheral device interfaces is video link.

9. The apparatus of claim 2, wherein said adapters are plugs that plug into the modules to interface said connectors.

10. The apparatus of claim 2 wherein said modules are PCMCIA cards.

11. In a computer having a chassis containing a processor, memory and a slot for housing a module coupled to said processor and memory via a bus, which slot has a connector for providing electrical contact between the module in the slot and a peripheral device, characterized by:

a) said connector having a first portion for making electrical connections between the module in the slot and a first peripheral device when the first peripheral device is connected to the computer system and a second portion for making electrical connections between the module in the slot and a second peripheral device when the second peripheral device is connected to the computer; and b) an adapter interface between said connector and said module for accepting either one of two adapters one adapter for coupling the module in the slot only to the first peripheral device through the first portion of the connector and the other adapter for coupling the module in the slot only to the second peripheral device through the second portion of the connector.

12. The apparatus of claim 11, wherein said computer system comprises a cartridge detachably connected to a chassis, wherein said cartridge houses said processor, memory and module, and wherein said chassis houses said connector.

13. The apparatus of claim 11, wherein said module comprises a modem, and wherein one of said first and second peripheral devices is a telephone line.

14. The apparatus of claim 11, wherein said module comprises a wired local area network adapter, and wherein one of said first and second peripheral devices is a local area network communication link.

15. The apparatus of claim 11, wherein said module comprises a wireless communication module, and wherein one of said first and second peripheral devices comprises an antenna.

16. The apparatus of claim 11, wherein said module comprises a data communication module, and wherein one of said first and second peripheral devices is a data communication link.

17. The apparatus of claim 11, wherein said module comprises a video interface adapter, and wherein one of said first and second peripheral devices is video link.

* * * * *